United States Patent [19]

Cooper, Jr. et al.

[11] Patent Number: 4,894,689
[45] Date of Patent: Jan. 16, 1990

[54] TRANSFERRED ELECTRON DEVICE
[75] Inventors: James A. Cooper, Jr., West Lafayette, Ind.; Karvel K. Thornber, Berkeley Heights, N.J.
[73] Assignee: American Telephone and Telegraph Company, AT&T Bell Laboratories, Murray Hill, N.J.
[21] Appl. No.: 687,127
[22] Filed: Dec. 28, 1984
[51] Int. Cl.$^4$ .................. H01L 27/26; H01L 47/00; H01L 47/02
[52] U.S. Cl. .................. 357/3; 357/23.14; 357/30; 357/57
[58] Field of Search ............... 357/16, 23.15, 23.14, 357/57, 24 M, 24 LR

[56] References Cited
U.S. PATENT DOCUMENTS

| 3,439,236 | 4/1969 | Blicher | 357/3 O |
| 3,587,000 | 6/1971 | Heeks | 357/3 X |
| 3,714,522 | 1/1973 | Komiya et al. | 357/23.14 O |
| 3,766,372 | 10/1973 | Kataoka et al. | 357/57 X |
| 4,236,165 | 11/1980 | Kawashima et al. | 357/32 X |
| 4,245,233 | 1/1981 | Lohstroh | 357/24 LR |

OTHER PUBLICATIONS

M. V. Whelan, L. A. Daverveld, J. G. de Groot, "Resistive-Insulated-Gate Arrays and Their Applications: An Explorative Study", Philips Research Reports, vol. 30, No. 6, pp. 436–482, Dec. 1975.

Primary Examiner—Andrew J. James
Assistant Examiner—Sara W. Crane
Attorney, Agent, or Firm—Richard D. Laumann

[57] ABSTRACT

A transferred electron device is described in which the charge of the drifting packets is imaged perpendicular to the charge-packet direction so that essentially all of the packet-averaged, space-charge field is normal to the drift direction. This permits continuous formation of contiguous charge packets.

11 Claims, 2 Drawing Sheets

TRANSFERRED ELECTRON DEVICE

TECHNICAL FIELD

This invention relates generally to the field of semiconductor devices and particularly to the field of transferred electron oscillators and amplifiers.

BACKGROUND OF THE INVENTION

Since the discovery of electro-magnetic radiation, there has been an almost continual effort to devise oscillators that will work at ever higher frequencies. If the frequency is greater than 0.1 GHz, it is commonly termed "microwave." One type of microwave oscillator uses microwave tubes which are capable of operating at frequencies as high as 300 GHz although lower frequencies are more typical. These tubes are typically complex metallic structures which use an appropriately modulated electron beam coupled to the desired electro-magnetic mode to permit energy transfer into the mode. Microwave tubes use a nonresonant circuit structure having the form of re-entrant cavities, helical slow wave structures, or coupled cavities as well as other structures. Even today, it is still probably true that microwave tubes furnish the highest power levels at most frequencies.

However, because of the desire to reduce both the size and cost of the oscillators, there has been a search for alternative structures which has recently, that is, for the last several decades, focused primarily on solid state, and especially semiconductor, oscillators. There is also a desire to make such oscillators which are compatible with integrated circuit (IC) devices. Several types of devices, including those using transferred electron effects, such as the Gunn diode, as well as those using transit time effects, such as the IMPATT diode, are exemplary of this art.

These semiconductor devices typically employ a semiconducting diode as a negative conductance element in an oscillator circuit including a tuned cavity to achieve frequency stability, tunability, efficiency and noise reduction. The negative conductance device, which serves as a power source, is placed in parallel with the tuned cavity, that is, the positive conductance element, thereby permitting the generation of high frequency oscillations which are characterized by the cavity mode. However, it will be readily appreciated that tunability is greatly restricted.

There are other device limitations and operating characteristics which appear to be intrinsic to such device structures. For example, during each cycle, a single charge packet is formed near one end of the diode and then traverses a portion of the drift region before being either dispersed or absorbed. Higher frequencies are generally sought by making the devices either or both smaller and capable of being driven still harder. It will be appreciated that ultimately the response times of the carrier distribution will limit the obtainable frequencies. Additionally, the device can support only one charge packet at any time. This limitation arises because the space-charge field due to the packet produces a voltage drop sufficient to drive the electric field in the remainder of the device below the threshold for charge-packet formation until the existing packet is dispersed. This, of course, also limits the maximum attainable frequency.

Except for high frequency transistors which are three terminal devices, the semiconductor oscillators are generally bulk, two terminal structures. High frequency transistors are often limited in their maximum operating frequency by both channel length and the resistive and capacitive parasitics. The two terminal structures use field distributions which are modified and controlled by doping profiles while power is dissipated throughout the device. If the device is sufficiently thin, the electrical contacts may also contribute to controlling the device operation. These features reduce the available design alternatives. Of course, microwave amplifiers are also of considerable interest.

SUMMARY OF THE INVENTION

We have found that a semiconductor device can be constructed in which limitations on oscillation frequency due to the, for example, formation, transit and relaxation times of charge packets may be avoided. Other limitations are also avoided as will be discussed, as will uses other than as an oscillator. The device comprises a semiconductor region exhibiting negative differential conductivity and having a channel capable of confining mobile carriers so as to form a conducting channel, a source of electrons in said region, a drain electrode to said region, an electrically conducting layer, said layer being spaced from said channel, and first and second electrodes to said electrically conducting layer. At least two of the electrodes are used to bias the channel into the region of negative differential conductivity. The electrically conducting layer may be spaced from the channel by an insulator layer. The image charges of the drifting charge packets in the negative differential conductivity region reside on the electrically conducting layer which is placed parallel to the layer in which the packet drift occurs. This results in screening of the space charge, and essentially all of the packet-averaged, space-charge field is normal to the drift direction characterized by an applied tangential field. More than one charge packet may propagate at any time. In one preferred embodiment, there is sufficient charge density so charge packets are continuously formed near the source. In another preferred embodiment, the electrons are confined in a potential well to achieve higher efficiency and power.

DETAILED DESCRIPTION

Figure 1:
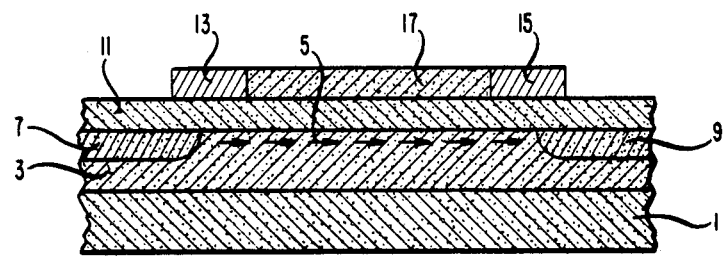
FIG. 1 is a sectional view of a heterojunction device useful as a microwave oscillator according to this invention.

An exemplary device is depicted in FIG. 1. For reasons of clarity, the elements of the device are not drawn to scale. The structure comprises substrate 1, semiconductor region 3 having a conducting channel 5, source and drain regions, i.e., electrodes 7 and 9, respectively, layer 11 and gate electrodes 13 and 15, respectively. The channel is schematically represented by the arrows. Electrodes 13 and 15 are electrically connected to opposite ends of resistive region 17.

Semiconductor region 3 comprises a semiconductor material that exhibits negative differential conductivity when appropriately biased. At least two of the electrodes may be used to bias the material into the negative differential conductivity region. Layer 11 comprises an insulator and, as will be discussed, is relatively thin. Region 17 is, in a preferred embodiment, electrically conducting although resistive. The tangential electric field is then uniform within the region when an appropriate bias voltage is applied to electrodes 13 and 15.

In the embodiment depicted, layer 11 comprises a material having a higher bandgap than has the semiconductor region 3. Source and drain regions 7 and 9 have a conductivity type opposite to that of the substrate. Consequently, assuming proper biasing, the carriers are confined to a potential well, near the interface between the substrate and the higher bandgap layer 11, which forms the drift region, i.e., channel, for the charge packets. Although the precise depth of the well is not critical, deeper wells permit greater current densities and higher efficiencies than do shallower wells. In an alternative embodiment, layer 11 is omitted, and the conducting channel 5 is spaced from resistive region 17 by means of a depleted region of the same conductivity type as the drain but less heavily doped.

Region 17 should have an electrical conductivity higher than that of the channel to make the idea of the image charge meaningful but not so high that a high electric field cannot be maintained. A high electric field means that the semiconductor region is in the negative differential mobility region.

Although the source is depicted as being an electrode, other means of injecting electrons may be used. For example, optical illumination may be used to create electron-hole pairs in the channel. The term "source" is thus used to mean a source of carriers for the channel. The semiconductor region is selected from the group consisting of Group II-VI, Group III-V and Group IV semiconductors which exhibit negative differential conductivity. The preferred materials are those exhibiting the largest negative differential mobility and the largest change in velocity $\Delta v$ between the top and bottom of the negative differential mobility region. The substrate may also comprise a semiconductor, such as GaAs, selected from the same Markush group. One exemplary material for region 3 is GaAs. For this case, a useful material for layer 11 would be AlGaAs. Other useful semiconductors exhibiting negative differential conductivity include InP, Ge, CdTe, InAs, InSb, ZnSe, $Ga_{0.5}In_{0.5}Sb$, $InAs_{0.2}P_{0.8}$ and $Ga_{0.13}In_{0.87}As_{0.37}P_{0.63}$.

The devices may be fabricated using conventional and well-known semiconductor processing technology. The semiconductor layers may be grown by conventional growth techniques and well-known lithographic techniques may be used to form the electrodes, etc. Insulator layers may also be formed by the use of well-known techniques.

For purposes of explanation, the operation of the device will be discussed by reference to the specific case of an AlGaAs/GaAs structure with a p-type substrate. That is, the substrate and region 3 are GaAs, layer 11 is AlGaAs and the source and drain regions have n-type conductivity. The drift field is created by the resistive film overlying the AlGaAs. The resistive film has ohmic contacts, i.e., gate electrodes 13 and 15, at each end and is biased positively with respect to the p-type semiconductor. A potential energy drop is impressed along the resistive gate and a uniform tangential, i.e., parallel to the interface, electric field is produced which sweeps electrons from left to right. The drain junction at the high voltage end of the gate is biased to collect the electrons that drift down the surface channel near the AlGaAs/GaAs interface. The source junction at the low voltage end of the gate is biased to supply electrons to the drift channel. The image charge of any charge packet will be in the resistive layer. The image charge may be thought of as absorbing the electric field of the charge packet which is, therefore, not seen by the source and drain or by other portions of the drift channel exterior to the charge packet.

The separation between the channel and the electrically conducting layer should be less than the wavelength of the oscillation for maximum screening of the space-charge field. The separation should, however, be great enough so that there is no breakdown due to the electric field between the channel and the resistive layer.

Figure 2:
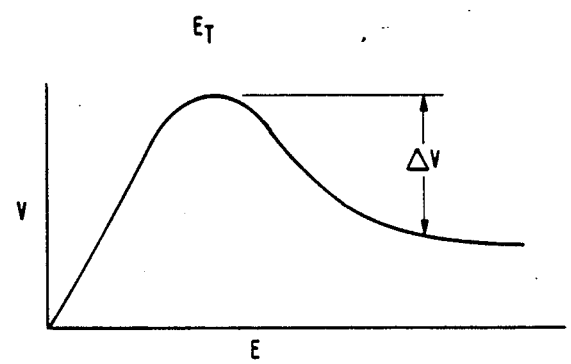
FIG. 2 plots the electric field horizontally versus the velocity vertically for an arbitrary material exhibiting negative differential conductivity.

It is perhaps useful at this point to discuss the velocity versus electric field characteristic curve depicted in FIG. 2 for an arbitrary material exhibiting negative differential conductivity. Both the velocity and electric field are plotted in arbitrary units. For values of E less than $E_T$, the differential conductivity is positive while it is negative for values greater than $E_T$. The value of $\Delta v$ is also shown. A fluctuation in the charge density in the negative differential conductivity region will grow in time.

It has been known that isolated electron packets in this structure, i.e., FIG. 1, broaden as the cube root of time when the differential mobility of the material in the conducting channel is positive. However, if the differential mobility is negative, the charge packet can be expected to contract until other effects, for example, diffusion, velocity-field dispersion and driving-field suppression at high frequency become important.

Figure 3:
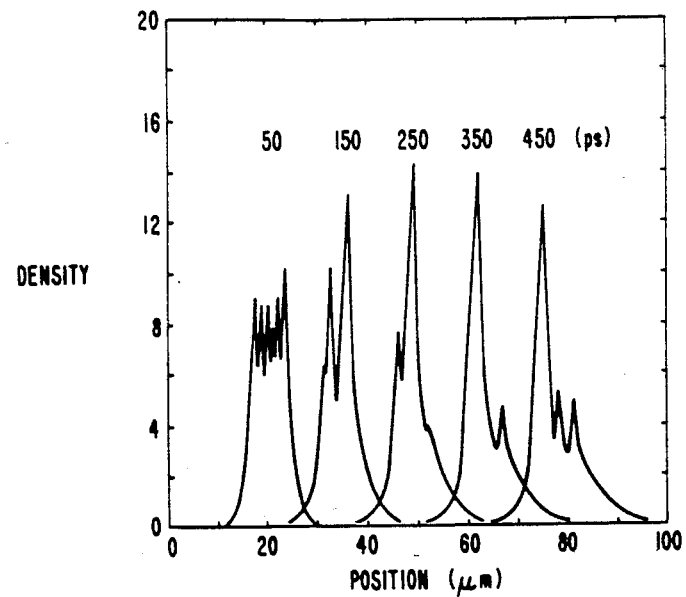
FIG. 3 plots electron density in the drift region at several times after injection of a rectangular charge packet.

The evolution of an individual charge packet when the structure is biased to a negative differential mobility regime may be better understood from the following considerations. One typical charge packet evolution is depicted in FIG. 3 which plots the position along the channel horizontally versus the charge density ($\times 10^{11}$ $cm^{-2}$) vertically for several times after optical charge injection. The AlGaAs layer is 100 nm thick, the drift field is 7000 V/cm, and the initial electron density is $7.5 \times 10^{11}/cm^2$ and the charges are injected between 10 $\mu m$ and 20 $\mu m$ from the start of the channel. The packet was initially rectangular, but rapidly developed sawtooth type oscillations which eventually coalesced into a single peak after approximately 250 ps of drift time. Optical means are expediently used to inject a rectangular charge packet. It will be readily appreciated that the oscillations occur because the negative differential mobility causes any charge density fluctuations to increase in magnitude. As the packet drifts, the width at half maximum contracts but the packet also develops secondary peaks on the leading edge which tend to reduce the height of the main peak.

Figure 4:
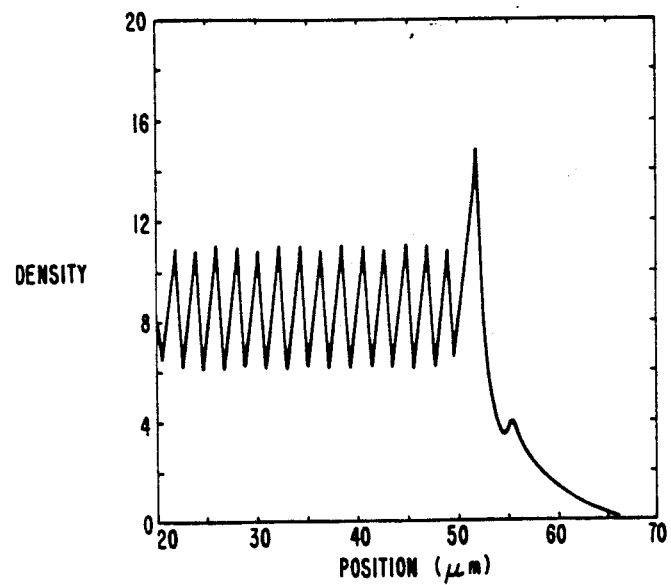
FIG. 4 plots the electron density in the drift channel under the conditions of a constant injection rate.

Of perhaps more interest is the fact that electrons can also be introduced into the drift channel at a constant rate and the channel can support more than one charge packet. FIG. 4 plots the position along the channel horizontally versus the charge density ($\times 10^{11}$ $cm^{-2}$) vertically for the case of steady charge injection. The device structure is the same as the structure described with respect to FIG. 3. Behind the initial peak, the electron density exhibits a uniform spatial oscillation. It is evident that the channel can support more than one charge packet at a time. This is better understood from the following considerations. The change in electric field, $\delta E$, resulting from small changes in charge density is $1/C\,(\partial \sigma/\partial X)$, suitably averaged over a region of the channel comparable with the effective insulator thickness, where $\sigma$ is the charge density and C is the capacitance per unit area between the drift channel 5 and resistive layer 17. The presence of the image charge on the resistive layer ensures that the spatial average of the induced field, and hence the space charge voltage drop across a packet, goes to zero although the local electric field can be large. Thus, all portions of the channel remain in the negative differential conductivity region and more than one charge packet can propagate in the channel.

Device parameters, both operating and structural, may be varied to obtain the desired type of operations. For example, if the insulator layer becomes thicker, the screening of the space charge becomes less effective and the maximum attainable frequency is reduced but the amplitude of the oscillation will be increased. However, if the insulator layer becomes too thin, the oscillations may become unstable at the desired frequency. It will be appreciated that the spacing between the channel and the resistive layer, appropriately scaled by the ratio of the permittivities of the insulator and of the semiconductor, i.e., the region between the channel and the resistive layer, should be less than the charge-packet width, i.e., the minimum wavelength of the oscillation.

The insulator layer may have a varying thickness between the source and drain electrodes. This is important because the boundary conditions at the source determine the oscillator frequency although this frequency is tunable by varying the gate voltage so that $\Delta V_{G1} = \Delta V_{G2}$, i.e., the voltage drop between electrodes 13 and 15 is unchanged. The current is then modulated in a manner analogous to that in an IGFET. Varying the gate voltages relative to each other varies the electric field in the channel and the operating point on the negative differential conductivity curve. In other words, the charge-packet velocity is varied. Thus, a thin insulator layer near the source will generate a high frequency. If the insulator layer thickness is now increased to a value determined by the gate voltage and frequency as the drain is approached along the channel, the amplitude of the oscillation may also be increased. Alternatively, the spacing of the channel from the resistive layer may be decreased.

For example, in the device whose characteristics are depicted in FIGS. 3 and 4, the charge packet is drifting to the right at approximately $1.3 \times 10^7$ cm/sec, and the electron current collected by the drain junction will oscillate at approximately 61.3 GHz. If the capacitance is now doubled by reducing the AlGaAs layer thickness to 50 nm, the amplitude of the oscillations will be reduced but the frequency will be further increased to 138 GHz. It should be added that this is a source generated frequency with a constant insulator thickness.

It should also be noted that the transit time and channel length do not determine either the frequency or amplitude of oscillation. It is therefore possible to fabricate devices having channels that are long as compared with those of more conventional semiconductor oscillators where transit times are a limiting factor but which operate at comparable frequencies. This obviously introduces design flexibility as larger devices may be fabricated.

There are several other aspects of our invention which merit comments. As drift velocities in the channel increase, higher velocities may be obtained. Frequencies as high as 2 THz should be attainable. The power dissipation is independent of frequency and amplitude. Consequently, the device operating characteristics exhibit a great deal of thermal stability. The conduction of the charged carriers is intrinsically planar. Thus, the device may be made large in the dimensions of the plane without any limitations arising from bulk heating effects.

The oscillator may also be used in a cavity to increase stability. However, as with a Gunn diode, this will also limit tunability. It is also possible to increase stability by feeding a portion of the output back to the input. This leads to a more stable output which is still tunable. The electrostatic energy of the packets is also independent of amplitude and frequency. Consequently, the device operating characteristics exhibit a great deal of electronic stability. It should be emphasized that the intrinsic frequency, thermal and electronic stabilities do not exclude the controlled variation of the frequency by external means.

Varying the gate voltage, i.e., the charge density, may be used to obtain a frequency modulated output. For example, for $\sigma = 15 \times 10^{11}/\text{cm}^2$, f is 25 GHz and for $\sigma = 7.5 \times 10^{11}/\text{cm}^2$, f is 61 GHz. It should be noted that the broad band tunability is based in part on the nonresonant structure of the device. Due to the stability of the oscillation, a second oscillator may be used as the local oscillator in a heterodyne detector. If an input signal is impressed upon the gate, the device may be used as an amplifier.

It should also be noted that the spacing between the channel and resistive layer may be large near the source and decrease as the drain is approached. In this embodiment, the channel conditions, and not the source, will determine the oscillator frequency.

Although one specific embodiment is described, it is to be understood that variations are contemplated. For example, the drifting electrons might be confined within a buried channel similar to that present in a GaAs MESFET. It will also be appreciated that the noise is relatively low as there is no ionization or avalanching.

What is claimed is:

1. A microwave device comprising
   a semiconductor region, said region having a regime of negative differential mobility;
   a source of carriers in said region;
   a drain electrode to said region, a channel in said region between said source and said drain electrode;
   an electrically conducting region separated from said channel; and
   first and second electrodes to said electrically conducting region, at least two of said electrodes biasing said semiconductor region into said regime of negative differential mobility.

2. A device as recited in claim 1 further comprising an insulator region between said electrically conducting region and said semiconductor region.

3. A device as recited in claim 2 in which said insulator region comprises a material having a bandgap higher than the bandgap of said semiconductor region.

4. A device as recited in claim 3 in which said insulator region has a varying thickness between said source and drain electrode.

5. A device as recited in claim 3 in which said insulator region has variable doping between said source and said drain electrode.

6. A device as recited in claim 1 in which said channel comprises a potential well.

7. A device as recited in claim 1 in which the separation between said electrically conducting region and said channel varies between said source and said drain electrode.

8. A device as recited in claim 7 in which said separation is a maximum near said source electrode.

9. A device as recited in claim 7 in which said separation is a minimum near said source electrode.

10. A device as recited in claim 1 in which said source comprises a source electrode to said region.

11. A device as recited in claim 1 in which said source comprises means for optically illuminating said region.

* * * * *